United States Patent
Cho et al.

(10) Patent No.: US 8,003,487 B2
(45) Date of Patent: Aug. 23, 2011

(54) METHODS OF MANUFACTURING A SEMICONDUCTOR DEVICE USING A LAYER SUSPENDED ACROSS A TRENCH

(75) Inventors: Du-Hyun Cho, Gyeonggi-do (KR);
Jong-Heui Song, Gyeonggi-do (KR);
Sang-Sup Jeong, Gyeonggi-do (KR);
Tae-Woo Kang, Gyeonggi-do (KR);
Seung-Joo Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 12/335,831

(22) Filed: Dec. 16, 2008

(65) Prior Publication Data
US 2009/0162989 A1 Jun. 25, 2009

(30) Foreign Application Priority Data
Dec. 21, 2007 (KR) ........................ 10-2007-0134840

(51) Int. Cl.
*H01L 21/76* (2006.01)
(52) U.S. Cl. .. 438/427; 438/780; 438/781; 257/E21.546
(58) Field of Classification Search .................. 438/427, 438/780, 781
See application file for complete search history.

(56) References Cited

U.S. PATENT DOCUMENTS
2004/0135264 A1 * 7/2004 Yamazaki et al. ............ 257/778

FOREIGN PATENT DOCUMENTS
| JP | 11-195702 A | 7/1999 |
|---|---|---|
| JP | 2005-294759 A | 10/2005 |
| JP | 2006-80310 A | 3/2006 |

* cited by examiner

*Primary Examiner* — Alexander G Ghyka
(74) *Attorney, Agent, or Firm* — Myers Bigel Sibley & Sajovec P.A.

(57) ABSTRACT

In methods of forming a trench, first patterns separated from each other by a first width and second patterns separated from each other by a second width are formed on a substrate. The second width is wider than the first width. The substrate is etched using the first patterns and the second patterns to form a first trench having a first depth and a preliminary second trench having a second depth. A sacrificial layer is formed to fill up a space between the first patterns. The substrate is etched using the sacrificial layer to form a second trench having a third depth deeper than the second depth.

13 Claims, 10 Drawing Sheets

METHODS OF MANUFACTURING A SEMICONDUCTOR DEVICE USING A LAYER SUSPENDED ACROSS A TRENCH

BACKGROUND

Example embodiments relate to methods of forming a trench in semiconductor devices. More particularly, example embodiments relate to methods of forming trenches having different depths in semiconductor devices.

Generally, non-volatile memory devices are capable of maintaining stored data without power. The non-volatile memory devices allow data to be electrically programmed therein or erased therefrom. The non-volatile memory devices are widely employed in various portable electronic devices such as MP3 players, cell phones, etc. for storing data.

The non-volatile memory devices may be divided according to a structure thereof into NAND-type memory devices and NOR-type memory devices. In the NAND-type memory devices, N unit cell transistors may be electrically connected to one another in series to form unit strings. The unit strings of the NAND-type memory devices may be electrically connected to one another in parallel between a bit line and a ground line. In the NOR-type memory devices, each of the cell transistors may be electrically connected to a bit line and a ground line in parallel.

The non-volatile memory devices may electrically control inputting/outputting of data utilizing a Fowler-Nordheim (F-N) tunneling mechanism or a channel hot electron injection mechanism. The non-volatile memory device utilizing the F-N tunneling mechanism may use a high voltage of tens of volts. The high voltage may cause a failure of the non-volatile memory devices due to breakdown voltages. In order to reduce or prevent the failure of the non-volatile memory devices, a trench in a peripheral region may be formed to be deeper and wider than a trench in a cell region.

Japanese Laid-Open Patent Publication No. 2006-080310, Japanese Laid-Open Patent Publication No. 2005-294759 and Japanese Laid-Open Patent Publication No. 11-195702 disclose methods of forming trenches having different depths in the cell region and the peripheral region, respectively. In these methods, a substrate is etched to form a cell trench having a narrow width in the cell region and a preliminary peripheral trench having a wide width in the peripheral region. The cell trench and the preliminary peripheral trench may have the same depth. An insulation layer is formed on the substrate to sufficiently fill up the cell trench. The insulation layer is conformally formed along profiles of an inner wall of the preliminary peripheral trench. The insulation layer is anisotropically etched to expose a lower face of the preliminary peripheral trench. The insulation layer remains on an inner sidewall of the preliminary peripheral trench. The exposed preliminary peripheral region trench is etched to form a peripheral trench that is deeper than the cell trench.

The peripheral trench formed using the above-mentioned method may have a stepped portion because the insulation layer remains in the inner sidewall. Thus, leakage current may be generated in the stepped portion.

SUMMARY

According to some example embodiments, there are provided methods of manufacturing semiconductor devices including trenches. In these methods, first patterns separated from each other and second patterns separated from each other are formed on a substrate. The first patterns are separated by a first width and the second patterns are separated by a second width that is wider than the first width. The substrate is etched using the first patterns and the second patterns as an etching mask to form a first trench having a first depth and a preliminary second trench having a second depth. A sacrificial layer is formed to cover the first patterns and fill up a space between the first patterns. The substrate is etched using the sacrificial layer as an etching mask to form a second trench having a third depth deeper than the second depth.

In example embodiments, the sacrificial layer may be formed using a polymer including carbon. Examples of the polymer including carbon may include polyethylene, polyvinyl fluoride, polyvinylidene fluoride, etc.

In example embodiments, the sacrificial layer may be formed by a polymer attachment process using a gas for forming the polymer. Examples of the gas for forming the polymer may include ethylene, methyl fluoride, methyl difluoride, etc. The polymer attachment process may be performed at a temperature of about 500° C. to about 800° C.

In example embodiments, the substrate may include a cell region and a peripheral region and the first trench may be formed in the cell region and the second trench may be formed in the peripheral region, respectively.

In example embodiments, a ratio between the first depth and the third depth may be in a range of about 1:1.5 to about 1:2.5.

In example embodiments, the sacrificial layer may be removed by an ashing process and a stripping process.

In example embodiments, the first patterns and the second patterns may be formed using a material having an etching selectivity with respect to the substrate.

According to other example embodiments, the sacrificial layer is removed after it is used as an etching mask. A field insulation layer is formed on the first patterns and the second patterns to fill up the first trench and the second trench. The field insulation layer is partially removed until the first patterns and the second patterns are exposed to form a first field insulation layer pattern and a second field insulation layer pattern defining an active region. A conductive structure is formed on the active region.

In example embodiments, the substrate may include a cell region and a peripheral region. The first field insulation layer pattern may be formed in the cell region to define the active region in the cell region and the second field insulation layer pattern may be formed in the peripheral region to define the active region in the peripheral region.

In example embodiments, the conductive structure formed on the active region in the cell region may include a tunnel insulation layer, a floating gate electrode, a dielectric layer pattern and a control gate electrode.

In example embodiments, the conductive structure formed on the active region in the peripheral region may include an insulation layer pattern and a conductive layer pattern.

According to example embodiments, the first trench in the cell region and the second trench in the peripheral region may be formed by the polymer attachment process. Thus, the first trench and the second trench having different depths may be efficiently formed in the substrate. Further, a thickness of the sacrificial layer on the preliminary second trench may be smaller than a difference between an upper width and a lower width of the preliminary second trench. Thus, a stepped portion may not be generated on a sidewall of the second trench.

Semiconductor devices may be manufactured according to other example embodiments by forming a first opening and a second opening that is wider than the first opening, in a first layer on a substrate. The substrate is etched through the first and second openings in the first layer, to form respective first and second trenches in the substrate. A second layer that is suspended across the first trench, but is not suspended across the second trench, is then formed. The second trench across which the second layer is not suspended is further etched, while preventing at least some further etching of the first trench by the second layer that is suspended across the first trench. The second layer is then removed.

In other example embodiments, the second layer is formed by forming a second layer that lines the first trench and is suspended across the first trench, and that lines the second trench but is not suspended across the second trench. In yet other embodiments, a void is formed between a portion of the second layer that lines the first trench and a portion of the second layer that is suspended across the first trench. In still other embodiments, the second layer is formed on the first layer, and is suspended across the first opening, but is not suspended across the second opening. The second layer may be formed according to any of the embodiments described herein for forming a sacrificial layer.

BRIEF DESCRIPTION OF THE DRAWINGS

Example embodiments will be more clearly understood from the following detailed description taken in conjunction with the accompanying drawings.

FIGS. 1 to 10 are cross-sectional views illustrating methods of forming a trench in a semiconductor device in accordance with example embodiments; and FIGS. 11 to 19 are cross-sectional views illustrating methods of manufacturing a semiconductor device including the trench in accordance with example embodiments.

DETAILED DESCRIPTION OF THE EMBODIMENTS

Figure 1:
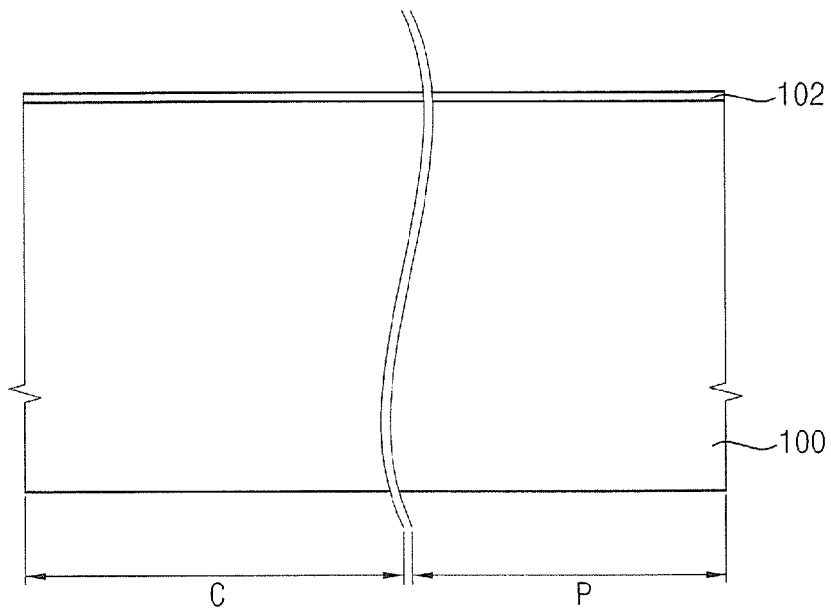
FIGS. 1 to 19 represent non-limiting, example embodiments as described herein.

This application claims priority under 35 USC §119 to Korean Patent Application No. 10-2007-0134840, filed on Dec. 21, 2007, the disclosure of which is hereby incorporated herein by reference in its entirety as if set forth fully herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example., of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1A to 10 are cross-sectional views illustrating methods of forming a trench in a semiconductor device according to example embodiments.

Referring to FIG. 1, a pad oxide layer 102 may be formed on a substrate 100.

The substrate 100 may include a semiconductor substrate such as silicon substrate, a germanium substrate, a silicon-germanium substrate, etc. Alternatively, the substrate 100 may include a silicon-on-insulator (SOI) substrate, a germanium-on-insulator (GOI) substrate, etc. Any other microelectronic substrate may be used.

The substrate 100 may include a cell region C in which memory cells are arranged and a peripheral region P in which circuit cells are arranged. However, embodiments are not limited to memory devices.

In example embodiments, the pad oxide layer 102 may be formed using silicon oxide by a thermal oxidation process, a chemical vapor deposition (CVD) process, etc. Various combinations and subcombinations may be used.

Figure 2:
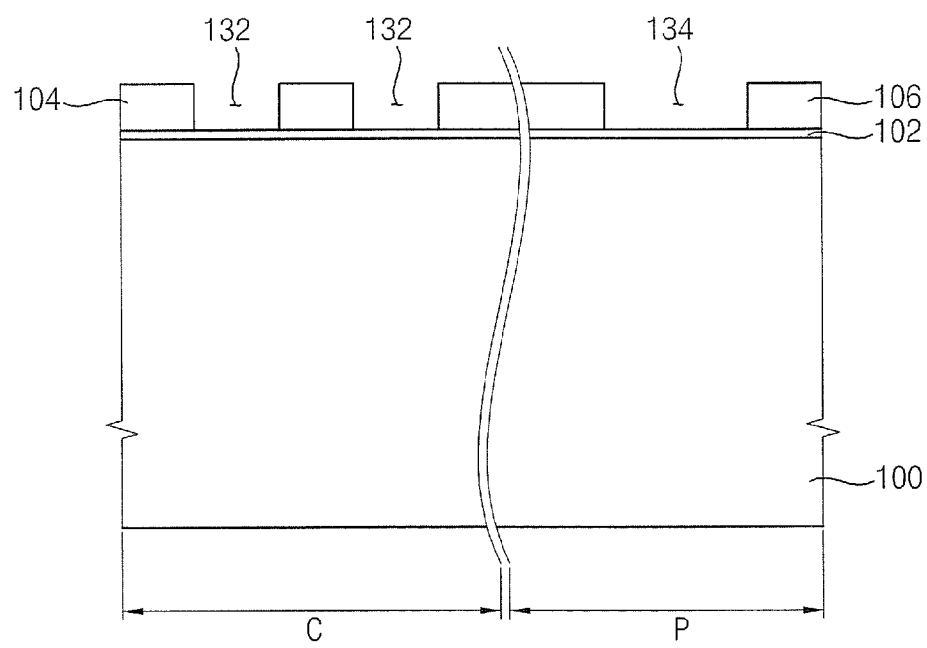

Referring to FIG. 2, first patterns 104 and second patterns 106 are formed on the pad oxide layer 102.

The first patterns 104 are formed in the cell region C. In example embodiments, the first patterns 104 may be separated from each other by a first width. The second patterns 106 are formed in the peripheral region 106. In example embodiments, the second patterns 106 may be separated from the each other by a second width that is wider than the first width.

FIG. 2 may also be regarded as illustrating forming a first opening 132 between the first patterns 104 and a second opening 134 between the second patterns 106 that is wider than the first opening 132 on a substrate 100. Thus, the first width may be defined by the width of the first opening 132 and the second width may be defined by the width of the second opening 134.

The first patterns 104 and the second patterns 106 may be formed using materials having an etching selectivity with respect to the substrate 100. In example embodiments, the first patterns 104 and the second patterns 106 may be formed using a nitride, an oxide, a carbide, etc. Various combinations and subcombinations may be used. For example, the first patterns 104 and the second patterns 106 may have a single-layer structure or a multilayer structure including the above-mentioned materials having the etching selectivity with respect to the substrate 100.

In a formation process of the first patterns 104 and the second patterns 106 according to some embodiments, after forming a first layer including a nitride (not illustrated) on the pad oxide layer 102, an amorphous carbon layer (not illustrated) and an organic anti-reflection layer (not illustrated) may be formed on the first layer including the nitride. The amorphous carbon layer and the organic anti-reflection layer may reduce or prevent a sidewall of a photoresist pattern from having a poor profile due to a diffused reflection in a subsequent photolithography process. First photoresist patterns and second photoresist patterns (not illustrated) may be formed on the organic anti-reflection layer. The first photoresist patterns may be separated from each other by the first width and the second photoresist patterns may be separated from each other by the second width. The amorphous carbon layer, the organic anti-reflection layer and the first layer including the nitride may be etched using the first photoresist patterns and the second photoresist patterns as a mask to form the first patterns 104 and the second patterns 106 in the first layer, organic anti-reflection layer patterns (not illustrated) and amorphous carbon layer patterns (not illustrated) on the pad oxide layer 102. After forming the first patterns 104 and the second patterns 106, the organic anti-reflection layer patterns, the amorphous carbon layer patterns, and the first and the second photoresist patterns may be removed. Other techniques may be used in other embodiments.

Figure 3:
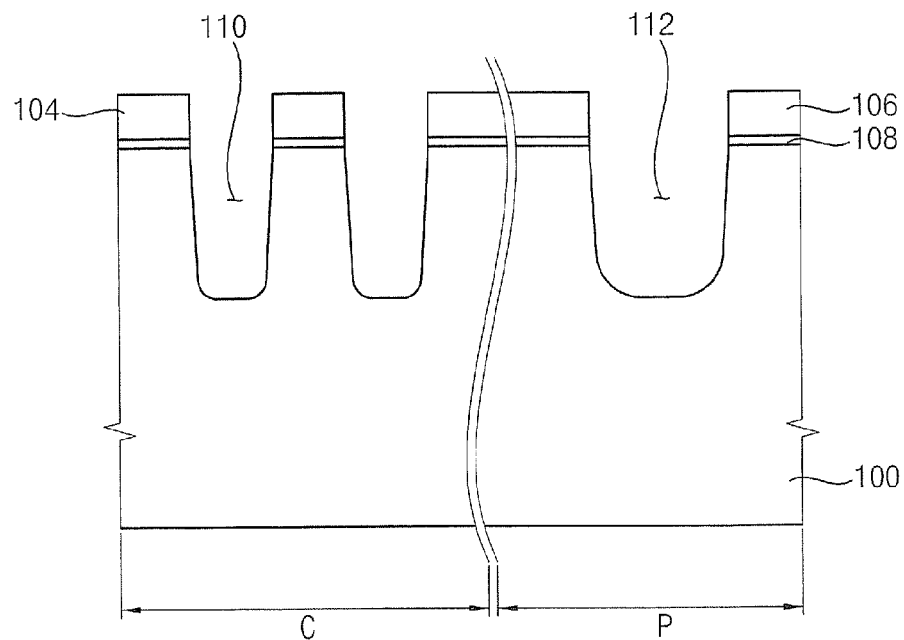

Referring to FIG. 3, the pad oxide layer 102 and the substrate 100 are etched using the first patterns 104 and the second patterns 106 as a mask to form a pad oxide layer pattern 108, a first trench 110 and a preliminary second trench 112. Accordingly, FIG. 3 illustrates etching the substrate 100 through the first opening 132 and the second opening 134 in the first layer 104, 106, to form respective the first trench 110 and the preliminary second trenches 112, respectively, in the substrate 100.

The first trench 110 may be formed in the cell region C. The first trench 110 may have an upper width the same as the first width and a lower width narrower than the first width. The first trench 110 may have a first depth. In example embodiments, the first trench 110 may have the first depth of about 1,800 Å to about 2,500 Å.

The preliminary second trench 112 may be formed in the peripheral region P. The preliminary second trench 112 may have an upper width the same as the second width and a lower width narrower than the second width. The preliminary second trench 112 may have a second depth. In example embodiments, the second depth may be the same as the first depth.

Figure 4:
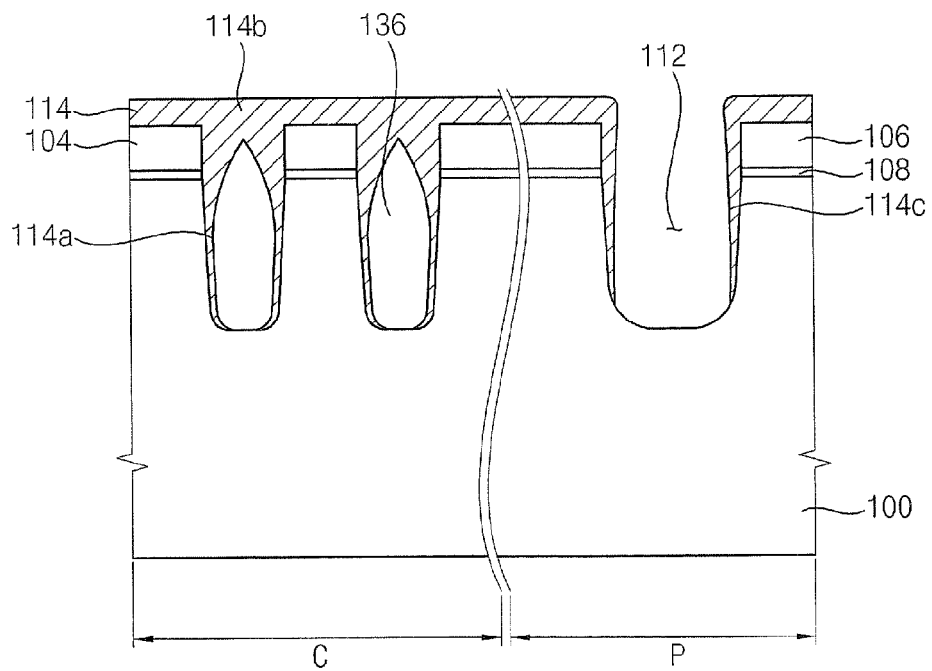

Referring to FIG. 4, a second layer 114 serving as the sacrificial layer is formed on the first patterns 104 to cover the first patterns 104 and to fill up a space between the first patterns 104. The space between the first patterns 104 may correspond to the first opening 132. Accordingly, FIG. 4 describes the formation of the second layer 114 serving as a sacrificial layer that is suspended across the first trench 110, but is not suspended across the preliminary second trench 112. As also shown in FIG. 4, the second layer 114 serving as the sacrificial layer may line the first trench 110, as shown at 114a, and is suspended across the first trench 110, as shown at 114b. The second layer 114 serving as the sacrificial layer also lines the preliminary second trench 112, as shown at 114c, but is not suspended across the preliminary second trench 112. Moreover, the suspension of the second layer 114 serving as the sacrificial layer across the first trench 110 forms a void 136 between a portion 114a of the second layer 114 serving as the sacrificial layer that lines the first trench 110 and a portion 114b of the second layer 114 serving as the sacrificial layer that is suspended across the first trench 110.

In some embodiments, the second layer 114 serving as the sacrificial layer is formed on the first layer including the first patterns 104 and the second patterns 106 and is suspended across the first opening 132, but is not suspended across the second opening 134 between the second patterns 106 in the first layer. In other embodiments, however, the first layer including first patterns 104 and the second patterns 106 may be removed prior to forming the second layer 114 serving as the sacrificial layer.

In example embodiments, second layer 114 serving as the sacrificial layer may be formed using a gas for forming a polymer by a polymer attachment process. The polymer attachment process may be performed using a polymerization reaction. The second layer 114 serving as the sacrificial layer may have different chemical properties and physical properties according to a temperature at which the polymer attachment process is performed. When the polymer attachment process is performed at a temperature higher than about 800° C., the second layer 114 serving as the sacrificial layer may be formed on the first trench 110 and a lower face of the preliminary second trench 112. When the polymer attachment process is performed at a temperature less than about 500° C., the polymerization reaction may not be performed. Thus, the polymer attachment process may be performed at a temperature of about 500° C. to about 800° C.

In example embodiments, when the polymer attachment process is performed at a temperature of about 650° C., the second layer 114 serving as the sacrificial layer may be formed on the first patterns 104, the space between the first patterns 104 and upper faces and sidewalls of the second patterns 106 because the polymer may not sufficiently move into an inner space and the lower faces of the first trench 110 and the preliminary second trench 112. Thus, the second layer 114 serving as the sacrificial layer may fill up the space between the first patterns 104 separated from each other by the relatively narrow first width. The second layer 114 serving as the sacrificial layer may not sufficiently fill up a space between the second patterns 106 separated from each other by the second width that is wider than the first width. The space between the second patterns 106 may correspond to the second opening 134.

In one example embodiment, when the polymer attachment process is performed using ethylene, the second layer 114 serving as the sacrificial layer may include polyethylene. In another example embodiment, when the polymer attachment process is performed using methyl fluoride, the second layer 114 serving as the sacrificial layer may include polyvinyl fluoride. In still another example embodiment, when the polymer attachment process is performed using methyl difluoride, the second layer 114 serving as the sacrificial layer may include polyvinylidene fluoride. Combinations and subcombinations of these materials and/or processes may be used.

As mentioned above, the second layer 114 serving as the sacrificial layer may include the polymer so that the second layer 114 serving as the sacrificial layer may have a denser and harder structure than that of a mask formed using a nitride, an oxide, etc. Thus, when the second layer 114 serving as the sacrificial layer may be used for an etching mask in a subsequent etching process, the first patterns 104 and the second patterns 106 may not be damaged during the subsequent etching process.

Figure 5:
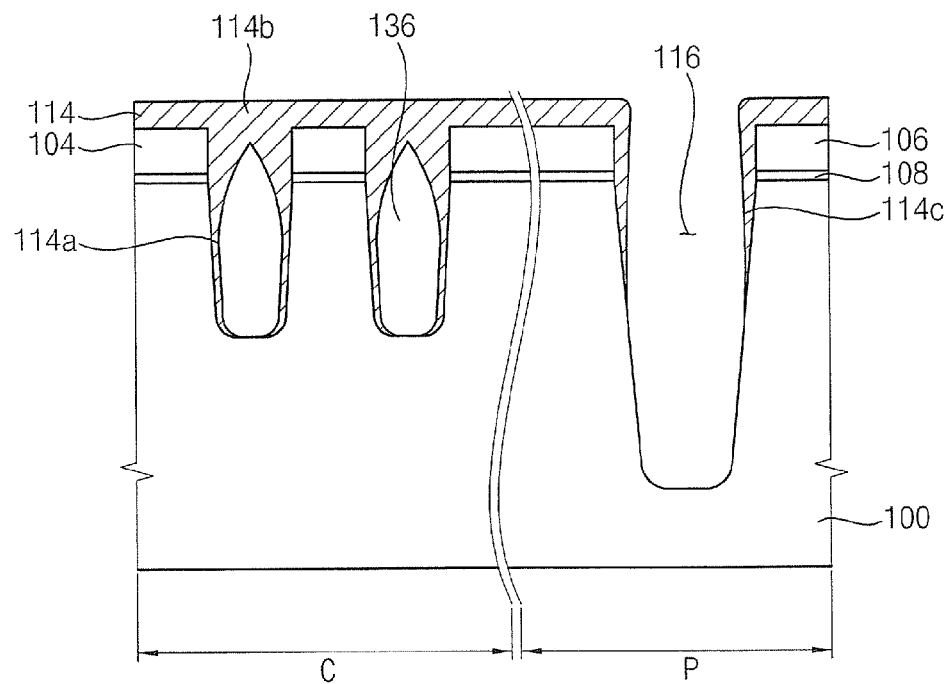

Referring to FIG. 5, the preliminary second trench 112 is etched using the second layer 114 serving as the sacrificial layer as an etching mask to form a second trench 116. Accordingly, FIG. 5 illustrates further etching the preliminary second trench 112 across which the second layer 114 serving as the sacrificial layer is not suspended, while preventing at least some further etching of the first trench 110 by the second layer 114b that is suspended across the first trench 110. In some embodiments, the second layer 114b prevents any etching of the first trench 110.

The second trench 116 may have a width the same as the second width and may have a third depth deeper than the first depth. In example embodiments, a ratio between the first depth and the third depth may be a range of about 1:1.5 to about 1:2.5. For example, the first depth may be in a range of about 1,800 Å to about 2,500 Å and the third depth may be in a range of about 4,800 Å to about 5,500 Å.

The second layer 114 serving as the sacrificial layer may fill up the space between the first patterns 104 corresponding to the first opening 132 and may cover the first pattern 104 so that the first trench 110 may not be etched while the preliminary second trench 112 is etched. The second layer 114 serving as the sacrificial layer may not sufficiently fill up the space between the second patterns 106 corresponding to the second opening 134 to be partially formed on the upper faces and the sidewalls of the second patterns 106. Although the second layer 114 serving as the sacrificial layer may be formed on the upper faces and the sidewalls of the preliminary second trench 112, the second layer 114c on the preliminary second trench 112 may be thinner than a difference between the upper width and the lower width of the preliminary second trench 112 so that a stepped portion may not be generated on a sidewall of the second trench 116.

In example embodiments, the second layer 114 serving as the sacrificial layer may sufficiently cover the first patterns 104 so that additional deposition processes and additional etching processes may not be performed. Thus, a time and a cost may be reduced in forming the trench.

An etching amount of the second layer 114 serving as the sacrificial layer may be less than that of a mask including a nitride, an oxide, etc. because the second layer 114 serving as the sacrificial layer is formed using the polymer. Thus, the first patterns 104 and the second patterns 106 may not be damaged while the preliminary second trench 112 is etched.

Figure 6:
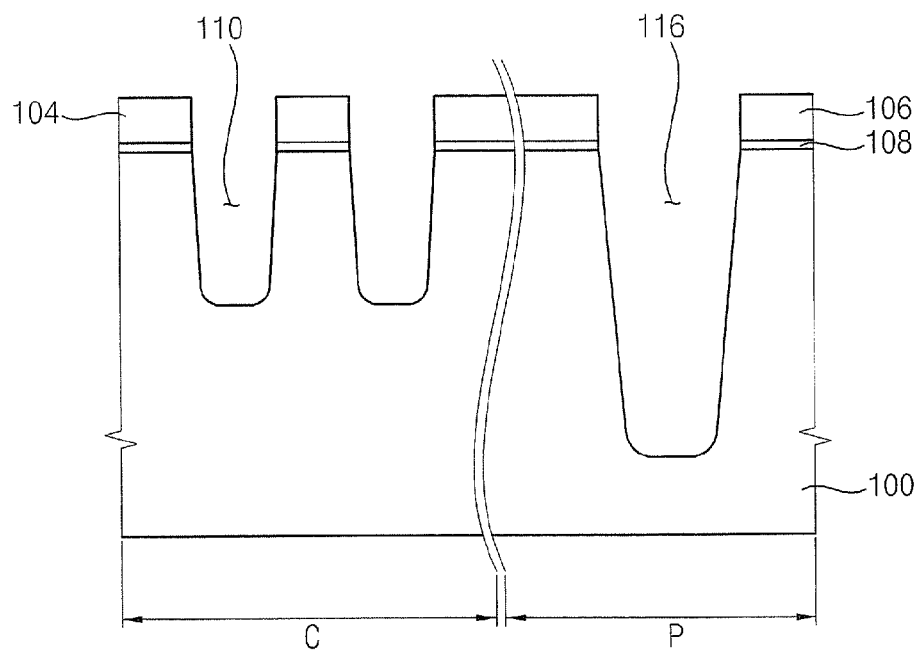

Referring to FIG. 6, the second layer 114 serving as the sacrificial layer is removed from the first patterns 104 and the second patterns 106. When the second layer 114 serving as the sacrificial layer is formed on the first patterns 104, the second patterns 106, the first trench 110 and the second patterns 116, the entire second layer 114 serving as the sacrificial layer may be removed from the first patterns 104, the second patterns 106, the first trench 110 and the second patterns 116. In other embodiments, however, some of the sacrificial layer may remain.

In example embodiments, the second layer 114 serving as the sacrificial layer may be removed by an ashing process and/or a stripping process. The second layer 114 serving as the sacrificial layer may be burned using a plasma to be removed in gaseous form in the ashing process. The remaining second layer 114 serving as the sacrificial layer 114 after the ashing process may be removed using an etching solution. Other processes may be used.

Figure 7:
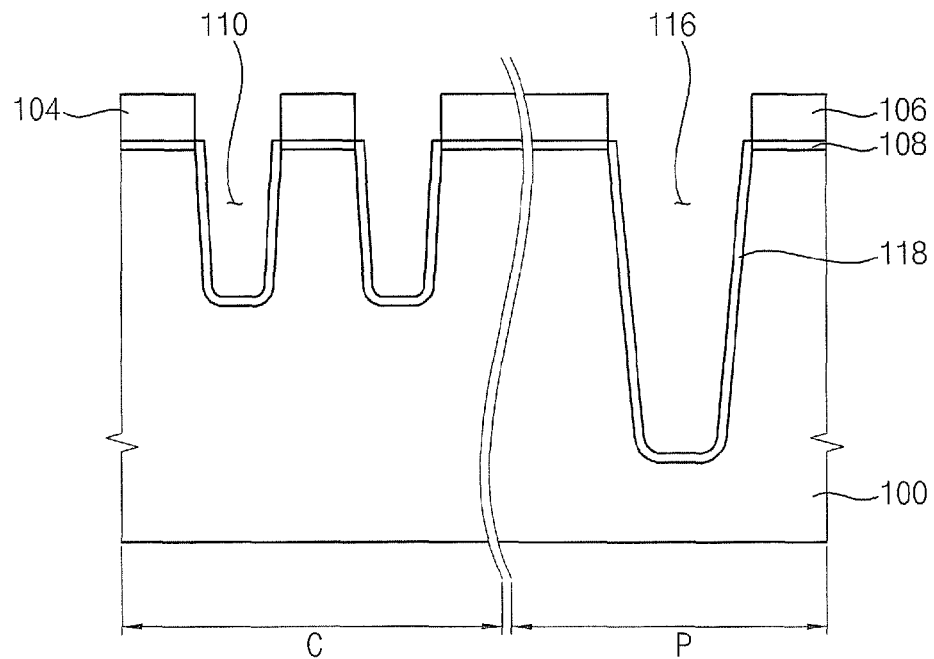

Referring to FIG. 7, a thermal oxide layer 118 is formed on the first trench 110 and the second trench 116. The thermal oxide layer 118 may be conformally formed along profiles of the first trench 110 and the second trench 116. Thus, the thermal oxide layer 118 may not fill up the first trench 110 and the second trench 116. When the substrate 100 is damaged during formation of the first trench 110 and the second trench 116, the thermal oxide layer 118 may at least partially cure the damage of substrate 100.

In example embodiments, the thermal oxide layer 118 may be formed by a thermal oxidation process. When the thermal oxide layer 118 is formed by the thermal oxidation process, the substrate 100 exposed by the first trench 110 and the second trench 116 may be thermally oxidized to form the thermal oxide layer 118 on sidewalls and lower faces of the first trench 110 and the second trench 116. The thermal oxide layer 118 may extend to a portion on which the pad oxide pattern 108 is formed.

In example embodiments, the thermal oxide layer 118 may be formed by a CVD process. When the thermal oxide layer 118 is formed by the CVD process, the thermal oxide layer 118 may be conformally formed along profiles of the first trench 110 the second trench 116, the first patterns 104 and the second patterns 106.

Figure 8:
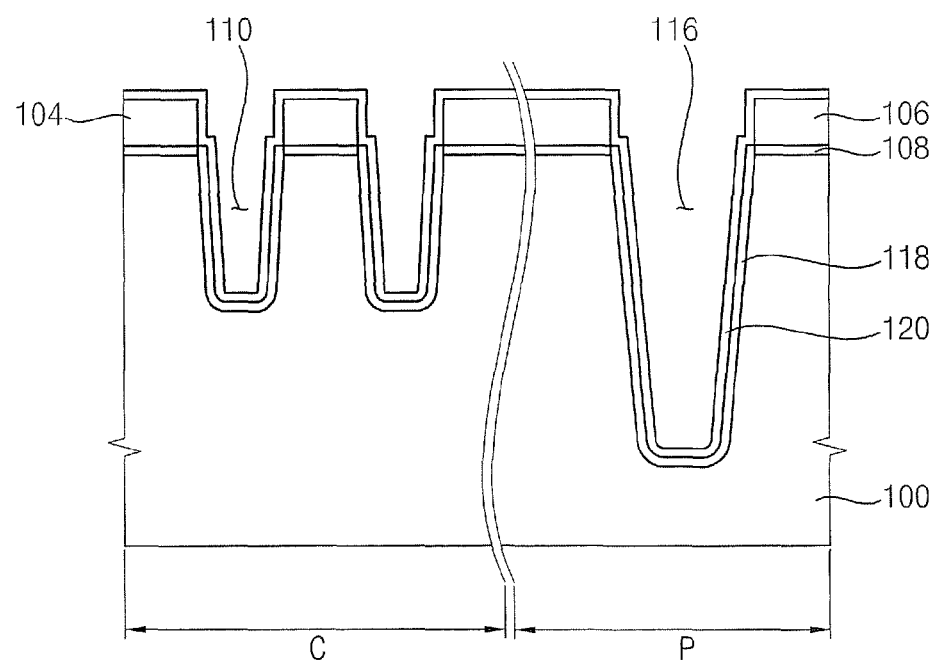

Referring to FIG. 8, a liner 120 is formed on the thermal oxide layer 118. The liner 120 may be conformally formed along profiles of the first trench 110 and the second trench 116 on the thermal oxide layer 118. Thus, the liner 120 may not fill up the first trench 110 and the second trench 116. The liner 120 may reduce or prevent impurities from being diffused into a field insulation layer 122 (see FIG. 9) formed in the first trench 110 and the second trench 116. In example embodiments, the liner 120 may be formed using a nitride by a CVD process. Other processes may be used.

Figure 9:
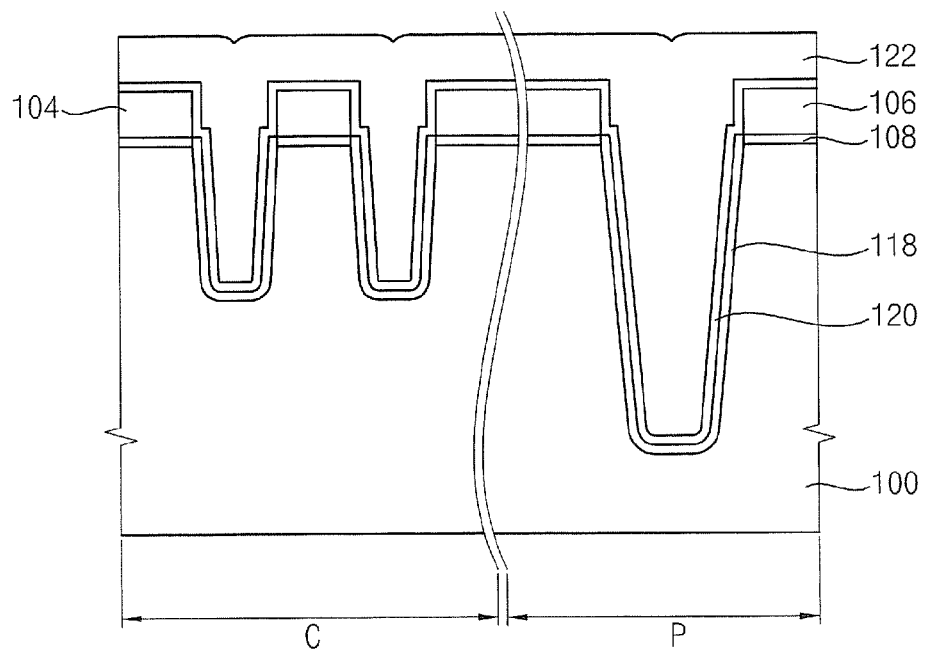

Referring to FIG. 9, the field insulation layer 122 is formed on the first patterns 104 and the second patterns 106 to fill up the first trench 110 and the second trench 116.

The field insulation layer 122 may be formed using an oxide, a nitride, etc. In example embodiments, the field insulation layer 122 may be formed using the oxide such as silicon oxide having superior gap-filling characteristics. For example, the field insulation layer 122 may be formed using undoped silicate glass (USG), borophosphosilicate glass (BPSG), phosphosilicate glass (PSG), flowable oxide (FOx), plasma-enhanced tetraethyl orthosilicate (PE-TEOS), Tonen silazene (TOSZ), fluorosilicate glass (FSG), etc. These may used alone or in a combination/subcombination thereof.

Figure 10:
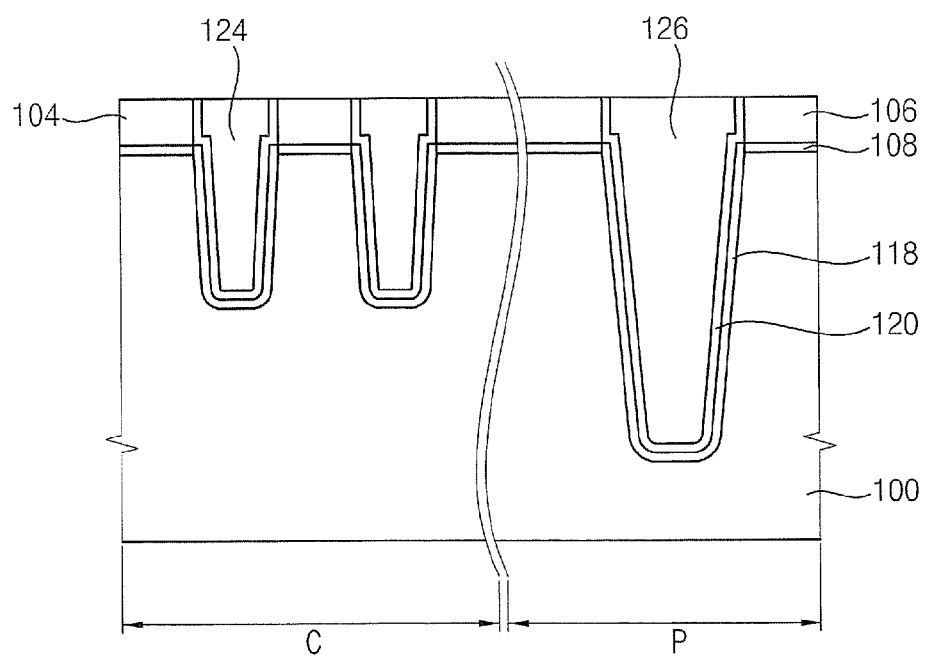

Referring to FIG. 10, the field insulation layer 122 is partially removed until the first patterns 104 and the second patterns 106 are exposed to form a first field insulation layer pattern 124 filling up the first trench 110 and a second field insulation layer pattern 126 filling up the second trench 116. The first field insulation layer pattern 124 is formed in the cell region C and the second field insulation layer pattern 126 is formed in the peripheral region P. The first field insulation layer pattern 124 and the second field insulation layer pattern 126 may be formed by a chemical mechanical polishing (CMP) process and/or an etch-back process. In other embodiments, however, the first and second patterns 104 and 106 may already have been removed between the operations of FIGS. 3 and 4, and the pad oxide 108 or another layer be used to determine an end point of the CMP process and/or etch-back process.

According to some example embodiments, the first field insulation layer pattern 124 having the first width and the first depth is formed in the cell region C and the second field insulation layer pattern 126 having the second width and the third depth is formed in the peripheral region P. The first trench 110 and the second trench 116 having different depths may be formed by the polymer attachment process. Thus, additional deposition processes and etching processes may not need to be performed in order to form trenches having the different depths to simplify processes of forming the trenches. Further, the second layer 114 serving as the sacrificial layer 114 may be used as the etching mask to form the second trench 116 having the sidewall without the stepped portion.

Hereinafter, methods of manufacturing a semiconductor device including the trenches according to example embodiments will be explained in detail with reference to the accompanying drawings.

FIGS. 11 to 19 are cross-sectional views illustrating methods of manufacturing a semiconductor device. Although FIGS. 11 to 19 illustrate methods of manufacturing a non-volatile semiconductor memory device, such as a NAND-type flash memory device having a self-aligned (SA) structure, other non-volatile semiconductor devices such as a planar-type non-volatile memory device or a self-aligned shallow trench isolation (SA-STI) structure may be manufactured through the methods illustrated in FIGS. 11 to 20.

Figure 11:
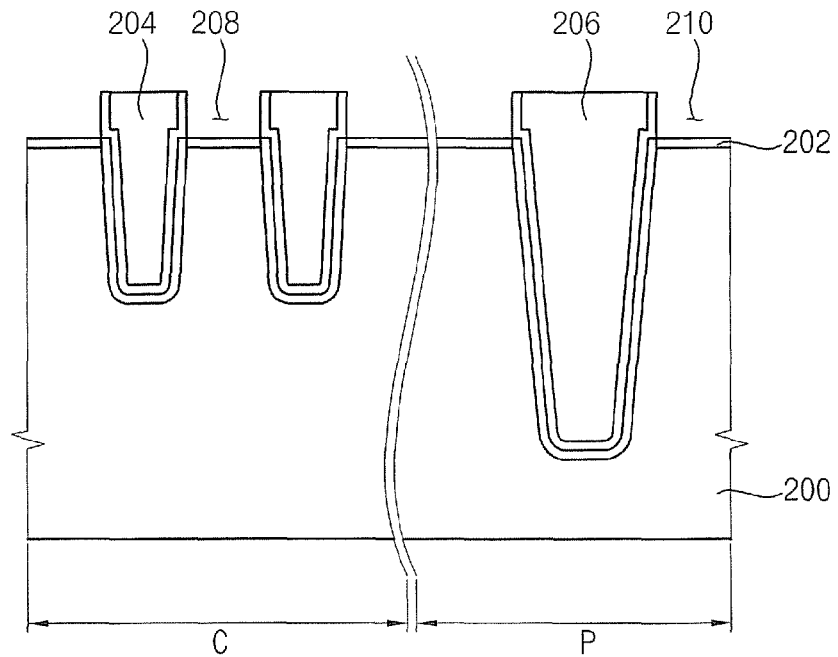

Referring to FIG. 11, a first field insulation layer pattern 204 and a second field insulation layer pattern 206 are formed on a substrate 200 including a cell region C and a peripheral region P. The first field insulation layer pattern 204 may be formed in the cell region C and the second field insulation layer pattern 206 may be formed in the peripheral region P. The first field insulation layer pattern 204 may have a first width and a first depth and the second field insulation layer pattern 206 may have a second width and a second depth. The second width may be wider than the first width and the second depth may be deeper than the first depth.

The first field insulation layer pattern 204 and the second field insulation layer pattern 206 may be formed by processes the same as or similar to those of a method illustrated with reference to FIGS. 1 to 10. Thus, any further detailed description of the processes forming the first field insulation layer pattern 204 and the second field insulation layer pattern 206 will be omitted in order to avoid redundancy.

The first patterns and second patterns are removed from the substrate 200. When the first patterns and the second patterns are removed, a first opening 208 defined by adjacent first field insulation layer pattern 204 is formed in the cell region C and a second opening 210 defined by adjacent second field insulation layer pattern 206 is formed in the peripheral region P.

Figure 12:
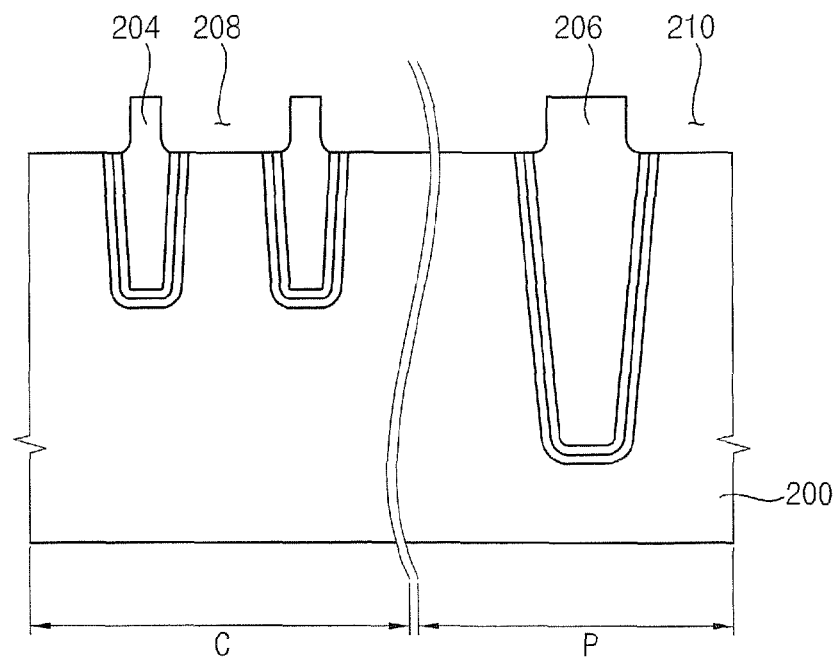

Referring to FIG. 12, a pad oxide layer pattern 202 is removed from the substrate 200. When the pad oxide layer pattern 202 is not removed from the substrate 200, the pad oxide layer pattern 202 may be damaged during subsequent processes such as forming a tunnel insulation layer 228 (see FIG. 19) and a gate insulation layer 238 (see FIG. 19). In example embodiments, the pad oxide layer pattern 202 may not be removed from the substrate 200 to be used for the tunnel insulation layer 228 and the gate insulation layer 238 in subsequent processes.

Sidewalls of the first field insulation layer pattern 204 and the second field insulation layer pattern 208 are partially removed to enlarge widths of the first opening 208 and the second opening 210, respectively. The widths of the first opening 208 and the second opening 210 may determine line widths of a floating gate electrode 230 (see FIG. 19) in a subsequent process. As the widths of the first opening 208 and the second opening 210 increase, the line widths of the floating gate electrode 230 may increase.

Figure 13:
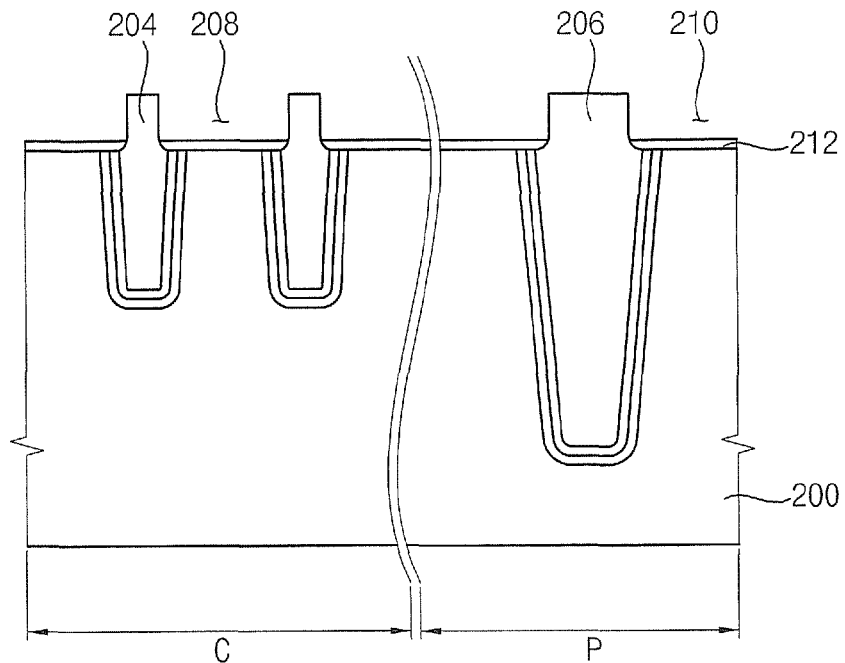

Referring to FIG. 13, a first insulation layer 212 is formed on the substrate 200 exposed by the first opening 208 and the second opening 210. The first insulation layer 212 formed in the cell region C may serve as the tunnel insulation layer 228 and the insulation layer 212 formed in the peripheral region P may serve as the gate insulation layer 238.

In example embodiments, the first insulation layer 212 may be formed using silicon oxide (SiOx), silicon oxynitride (SiONx), a metal oxide, etc. Examples of the metal oxide may include aluminum oxide (AlOx), hafnium oxide (HfOx), hafnium silicon oxide (HfSiOx), hafnium aluminum oxide (HfAlOx), hafnium lanthanum oxide (HfLaOx), zirconium oxide (ZrOx), zirconium silicon oxide (ZrSiOx), etc. Various combinations/subcombinations may be used.

In example embodiments, when the widths of the first opening 208 and the second opening 210 are enlarged, the first insulation layer 212 may be formed on the substrate 200 and the sidewalls of the first field insulation layer pattern 204 and the second field insulation layer pattern 206.

Figure 14:
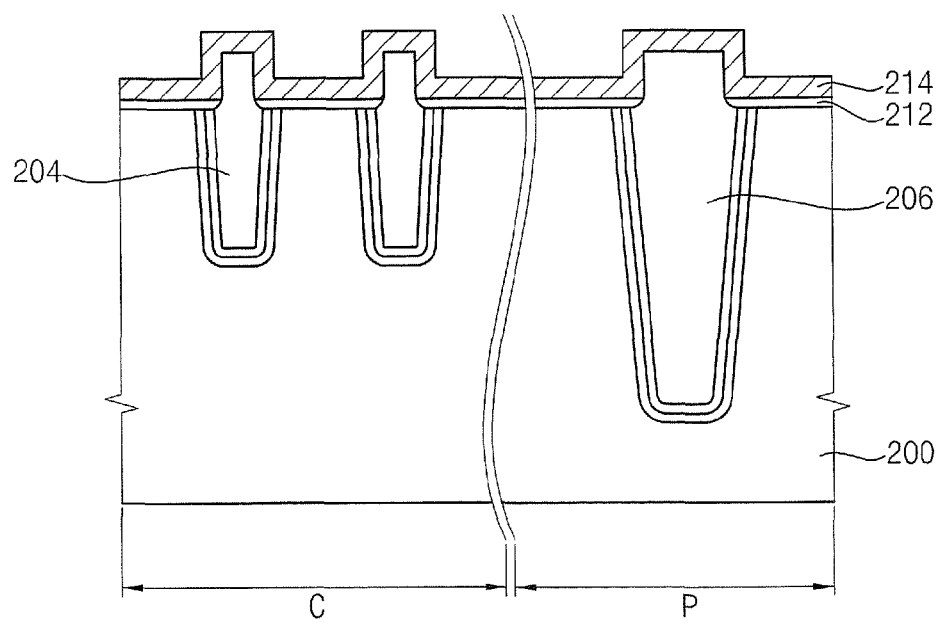

Referring to FIG. 14, a first conductive layer 214 is formed on the first insulation layer 212, the first field insulation layer pattern 204 and the second field insulation layer pattern 206. The first conductive layer 214 may be conformally formed along profiles of the first insulation layer 212, the first field insulation layer pattern 204 and the second field insulation layer pattern 206. Here, the first conductive layer 214 may partially fill the first opening 208 and the second opening 210.

In example embodiments, the first conductive layer 214 may be formed using polysilicon doped with impurities, a metal, a metal oxide, etc. For example, the first conductive layer 214 may be formed using tungsten (W), aluminum (Al), cobalt (Co), titanium (Ti), tantalum nitride (TaNx), titanium nitride (TiNx), etc. Various combinations/subcombinations may be used.

In example embodiments, the first conductive layer 214 may formed by a sputtering process, a CVD process, an atomic layer deposition (ALD) process, a pulsed laser deposition (PLD) process, an electron-beam deposition process, etc. Various combinations/subcombinations may be used.

Figure 15:
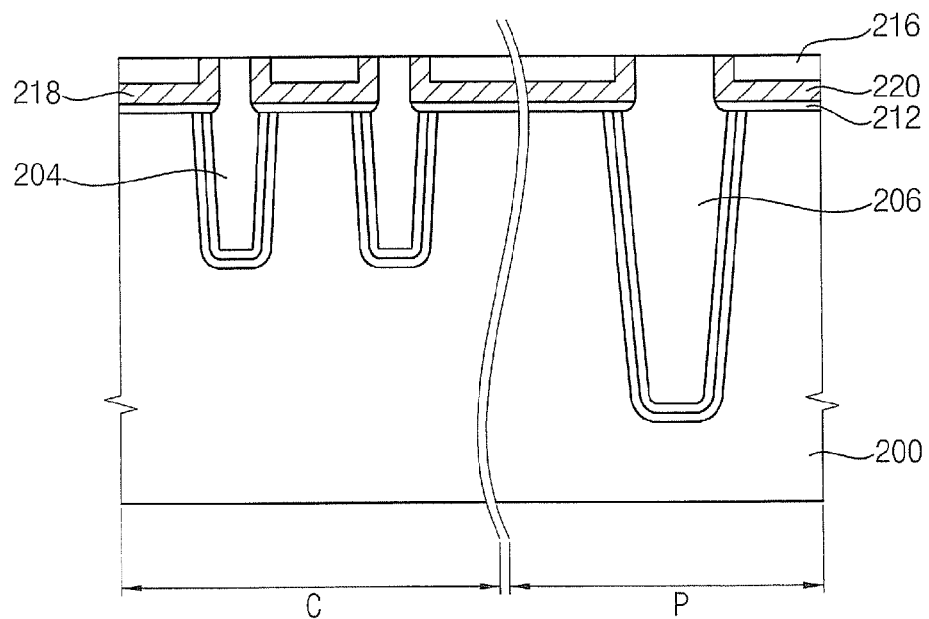

Referring to FIG. 15, a sacrificial layer (not illustrated) is formed on the first conductive layer 214 to fill up the first opening 208 and the second opening 210. The sacrificial layer may sufficiently fill up the first opening 208 and the second opening 210.

In example embodiments, the sacrificial layer may be formed using a photoresist or an oxide such as silicon oxide. For example, the sacrificial layer may be formed using USG, BPSG, PSG, FOx, PE-TEOS, TOSZ, FSG, etc. These may used alone or in a combination/subcombination thereof. The sacrificial layer may be formed using a material the same as that of the first field insulation layer pattern 204 and the second field insulation layer pattern 206.

The sacrificial layer is partially removed until an upper face of the first conductive layer 214 is exposed. The sacrificial layer may be partially removed by a CMP process and/or an etch-back process. Thus, a sacrificial layer pattern 210 may be formed in the first opening 208 and the second opening 210.

The first conductive layer 214 is partially removed until upper faces of the first field insulation layer pattern 204 and the second field insulation layer pattern 206 are exposed to form a first conductive layer pattern 218 and a second conductive layer pattern 220 on the first insulation layer 212. The first conducive layer pattern 218 may be formed in the cell region C and may be served as the floating gate electrode 230. The second conductive layer pattern 220 may be formed in the peripheral region P and may be served as the gate electrode 240 of a transistor 242 (see FIG. 19).

Figure 16:
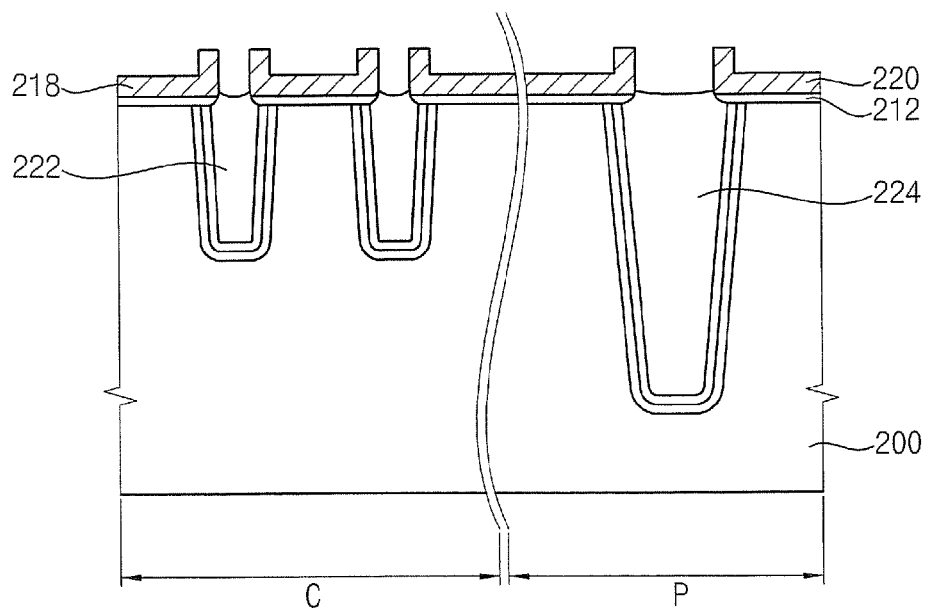

Referring to FIG. 16, the sacrificial layer pattern 216 is removed from the first opening 208 and the second opening 210 after the first conductive layer pattern 218 and the second conductive layer pattern 220 are formed.

In example embodiments, when the sacrificial layer pattern 216 includes an oxide, the first field insulation layer pattern 204 and the second field insulation layer pattern 206 may be partially removed to form a cell field insulation layer pattern 222 and a peripheral field insulation layer pattern 224 while the sacrificial layer pattern 216 is partially removed from the first opening 208 and the second opening 210. The cell field insulation layer pattern 222 and the peripheral field insulation layer pattern 224 may expose outer sidewalls of the first conductive layer pattern 218 and the second conductive layer pattern 220. Here, a contact area of the first conductive layer pattern 218 formed in the cell region C and a second insulation layer 226 (see FIG. 17) formed in a subsequent process may increase, and thus a coupling ratio of the non-volatile semiconductor device may be improved.

Figure 17:
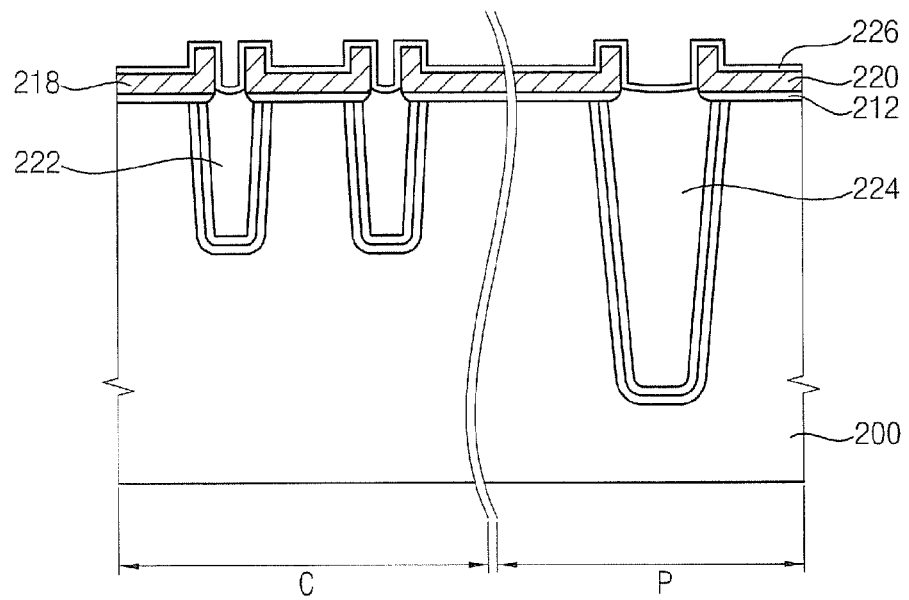

Referring to FIG. 17, the second insulation layer 226 is formed on the first conductive layer pattern 218, the second conductive layer pattern 220, the cell field insulation layer pattern 222 and the peripheral field insulation layer pattern 224. The second insulation layer 226 formed in the cell region C may be served as a dielectric layer in the non-volatile semiconductor device and the second insulation layer 226 formed in the peripheral region P may be partially removed in a subsequent etching process.

In example embodiments, the second insulation layer 226 may be formed using silicon oxide, silicon oxide/nitride/oxide, a material having a high dielectric constant, etc. The material having the high dielectric constant may have a higher dielectric constant than a nitride. For example, the material having a high dielectric constant may include a metal oxide such as aluminum oxide (AlOx), yttrium oxide (YOx), hafnium oxide (HfOx), zirconium oxide (ZrOx), niobium oxide (NiOx), barium titanium oxide (BaTiOx), strontium titanium oxide (SrTiOx), etc. The second insulation layer 226 may have a single-layer structure or a multilayer structure formed using the above-mentioned materials. Various combinations/subcombinations may be used.

Figure 18:
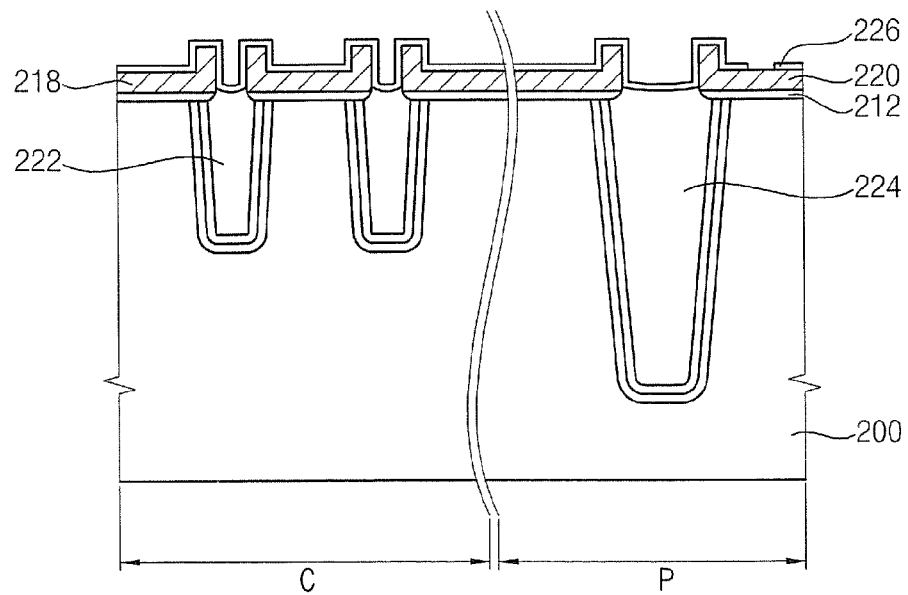

Referring to FIG. 18, the second insulation layer 226 is partially removed from the second conductive layer pattern 220 to partially expose an upper face of the second conductive layer pattern 220.

In example embodiments, the first conductive layer pattern 218 formed in the cell region C may be protected using a photoresist pattern or an oxide layer pattern while the second insulation layer 226 is partially removed from the second conductive layer pattern 220.

The second insulation layer 226 may be partially etched to electrically connect the second conductive layer pattern 220 and a second conductive layer (not illustrated) formed in a subsequent process.

Figure 19:
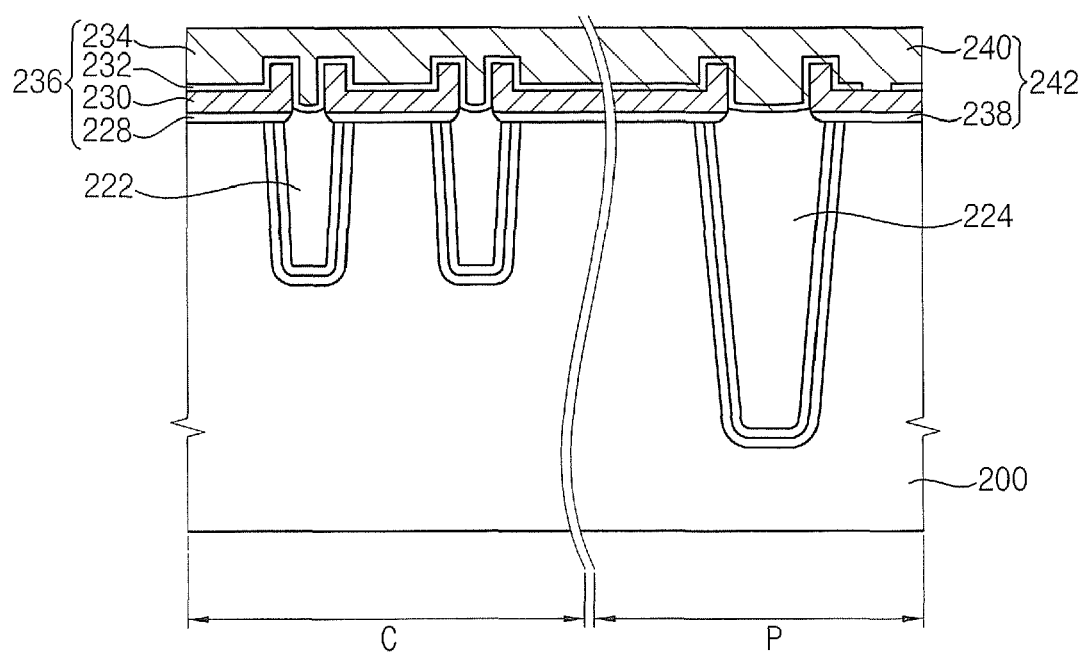

Referring to FIG. 19, the second conductive layer is formed on the partially etched second insulation layer 226. Here, the second conductive layer formed in the cell region C may be electrically insulated from the first conductive layer pattern 218 by the second insulation layer 226. The second conductive layer formed in the peripheral region P may be electrically connected with the second conductive layer pattern 220 because the second insulation layer 226 is partially removed from the second conductive layer pattern 220.

In example embodiments, the second conductive layer may be formed using polysilicon doped with impurities, a metal, a metal compound, etc. For example, the second conductive layer may be formed using tungsten, aluminum, cobalt, titanium, tantalum nitride, titanium nitride, etc. Various combinations/subcombinations may be used.

A mask (not illustrated) is formed on the second conductive layer. The second conductive layer, the second insulation layer 226, the first conductive layer pattern 218 and the second conductive layer pattern 220 are etched using the mask to form a unit cell 236 in the cell region C and a transistor 242 in the peripheral region P.

The unit cell formed in the cell region C may include the tunnel insulation layer 228, the floating gate electrode 230, a dielectric layer pattern 232 and a control gate electrode 234. The transistor 242 formed in the peripheral region P may include the gate insulation layer 238 and the gate electrode 240.

According to example embodiments, the trenches having different depths are formed using the sacrificial layer formed by the polymer attachment process. Thus, additional deposition processes and etching processes may not need to be performed in order to form trenches having the different depths to simplify processes of forming the trenches. Further, the preliminary second trench may be etched using the sacrificial layer as the etching mask to form the second trench without the stepped portion. When the sacrificial layer including the polymer may be used for the etching mask, the etching amount of the sacrificial layer may be reduced to reduce or prevent damage to the first patterns and the second patterns.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming first patterns separated from each other by a first width and second patterns separated from each other by a second width wider than the first width, on a substrate;
    etching the substrate using the first patterns and the second patterns as an etching mask to form a first trench having a first depth and a preliminary second trench having a second depth;
    forming a sacrificial layer to cover the first patterns and fill up a space between the first patterns while simultaneously filling up a space between the second patterns and exposing at least a floor of the preliminary second trench; and
    etching the substrate using the sacrificial layer as an etching mask to form a second trench having a third depth deeper than the second depth,
    wherein the sacrificial layer is formed by a polymer attachment process using a gas for forming the polymer; and
    wherein the polymer attachment process is performed at a temperature of about 500° C. to about 800° C.

2. The method of claim 1, wherein the sacrificial layer is formed using a polymer including carbon.

3. The method of claim 2, wherein the polymer including carbon includes polyethylene, polyvinyl fluoride and/or polyvinylidene fluoride.

4. The method of claim 1, wherein the gas for forming the polymer includes ethylene, methyl fluoride and/or methyl difluoride.

5. The method of claim 1, wherein the substrate includes a cell region and a peripheral region and the first trench is formed in the cell region and the second trench is formed in the peripheral region.

6. The method of claim 1, wherein a ratio between the first depth and the third depth is in a range of about 1:1.5 to about 1:2.5.

7. The method of claim 1, further comprising removing the sacrificial layer.

8. The method of claim 7, wherein the sacrificial layer is removed by an ashing process and/or a stripping process.

9. The method of claim 1, wherein the first patterns and the second patterns are formed using a material having an etching selectivity with respect to the substrate.

10. The method of claim 7, further comprising:
    forming a field insulation layer on the first patterns and the second patterns to fill up the first trench and the second trench;
    partially removing the field insulation layer until the first patterns and the second patterns are exposed to form a first field insulation layer pattern and a second field insulation layer pattern defining an active region; and
    forming a conductive structure on the active region.

11. The method of claim 10, wherein the substrate includes a cell region and a peripheral region and the first field insulation layer pattern is formed in the cell region to define the active region in the cell region and the second field insulation layer pattern is formed in the peripheral region to define the active region in the peripheral region.

12. The method of claim 11, wherein the conductive structure fanned on the active region in the cell region includes a tunnel insulation layer, a floating gate electrode, a dielectric layer pattern and a control gate electrode.

13. The method of claim 11, wherein the conductive structure formed on the active region in the peripheral region includes an insulation layer pattern and a conductive layer pattern.

* * * * *